(12) United States Patent
Tsutsui

(10) Patent No.: US 9,520,541 B2
(45) Date of Patent: Dec. 13, 2016

(54) LIGHT-EMITTING DEVICE INCLUDING PHOSPHORUS LAYER COVERING SIDE SURFACES OF SUBSTRATE AND LIGHT-EMITTING DEVICE PACKAGE INCLUDING THE SAME

(71) Applicant: SAMSUNG ELECTRONICS CO., LTD., Suwon-Si, Gyeonggi-do (KR)

(72) Inventor: Tsuyoshi Tsutsui, Suwon-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/520,205

(22) Filed: Oct. 21, 2014

(65) Prior Publication Data

US 2015/0034994 A1   Feb. 5, 2015

Related U.S. Application Data

(62) Division of application No. 13/297,809, filed on Nov. 16, 2011, now Pat. No. 8,889,437.

(30) Foreign Application Priority Data

Dec. 15, 2010   (KR) .................. 10-2010-0128607

(51) Int. Cl.
  *H01L 33/00*    (2010.01)
  *H01L 33/50*    (2010.01)
  *H01L 33/48*    (2010.01)

(52) U.S. Cl.
  CPC ........... *H01L 33/507* (2013.01); *H01L 33/486* (2013.01); *H01L 33/50* (2013.01); *H01L 33/501* (2013.01);
(Continued)

(58) Field of Classification Search
  CPC ........ H01L 33/50; H01L 33/502; H01L 33/52; H01L 33/507; H01L 33/508; H01L 33/504; H01L 33/483; H01L 33/62; H01L 33/56
(Continued)

(56) References Cited

U.S. PATENT DOCUMENTS 6,372,608 B1   4/2002   Shimoda et al.
6,645,830 B2   11/2003   Shimoda et al.
(Continued)

FOREIGN PATENT DOCUMENTS

CN         1364318 A      8/2002
JP       2004-221536 A    8/2004
(Continued)

OTHER PUBLICATIONS

Chinese Office Action issued in Chinese Application No. 201110396475.3 dated Apr. 27, 2015, with English Translation.
(Continued)

*Primary Examiner* — Minh-Loan Tran
(74) *Attorney, Agent, or Firm* — Harness, Dickey & Pierce, P.L.C.

(57) ABSTRACT

A light-emitting device including a phosphor layer, a light-emitting device package employing the light-emitting device, a method of manufacturing the light-emitting device, and a method of packaging the light-emitting device. The light-emitting device includes: a light-transmissive substrate having a top surface, a bottom surface, and side surfaces; a light-emitting unit formed on the top surface of the light-transmissive substrate; and a phosphor layer covering all the side surfaces of the light-transmissive substrate. According to the present invention, chromaticity inferiorities of light emitted from side surfaces of a substrate may be reduced.

17 Claims, 7 Drawing Sheets

(52) U.S. Cl.
CPC ........... *H01L 33/502* (2013.01); *H01L 33/505* (2013.01); *H01L 2224/48091* (2013.01); *H01L 2224/48247* (2013.01); *H01L 2224/73204* (2013.01); *H01L 2224/8592* (2013.01); *H01L 2933/0041* (2013.01)

(58) Field of Classification Search
USPC .................................................. 257/99, 100
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| D521,463 S | 5/2006 | Inoue | |
| D521,947 S | 5/2006 | Inoue | |
| D522,467 S | 6/2006 | Inoue | |
| 7,084,420 B2 | 8/2006 | Kim et al. | |
| 7,087,932 B2 | 8/2006 | Okuyama et al. | |
| 7,154,124 B2 | 12/2006 | Han et al. | |
| D536,308 S | 2/2007 | Inoue | |
| D540,270 S | 4/2007 | Inoue | |
| 7,208,725 B2 | 4/2007 | Sherrer et al. | |
| D544,847 S | 6/2007 | Inoue | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,535,168 B2 | 5/2009 | Keuper | |
| 7,535,518 B2 | 5/2009 | Lim et al. | |
| 7,550,772 B2 | 6/2009 | Toyota et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2006/0118510 A1 | 6/2006 | Fujii | |
| 2009/0008666 A1* | 1/2009 | Otsuka et al. | 257/98 |
| 2009/0278154 A1 | 11/2009 | Kim et al. | |
| 2010/0230691 A1* | 9/2010 | Inoue | C09K 11/7734 257/98 |
| 2010/0320479 A1* | 12/2010 | Minato et al. | 257/88 |
| 2011/0297980 A1 | 12/2011 | Sugizaki et al. | |

FOREIGN PATENT DOCUMENTS

| | | |
|---|---|---|
| JP | 2005-051194 A | 2/2005 |
| JP | 2007-243056 A | 9/2007 |
| JP | 2008-227550 A | 9/2008 |
| KR | 10-2006-0080339 A | 7/2006 |

OTHER PUBLICATIONS

Extended European Search Report issued in European Application No. 11193541.7 dated Oct. 28, 2015.

\* cited by examiner

LIGHT-EMITTING DEVICE INCLUDING PHOSPHORUS LAYER COVERING SIDE SURFACES OF SUBSTRATE AND LIGHT-EMITTING DEVICE PACKAGE INCLUDING THE SAME

CROSS-REFERENCE TO RELATED APPLICATIONS

This application is a divisional of U.S. patent application Ser. No. 13/297,809, filed on Nov. 16, 2011, which claims the benefit of Korean Patent Application No. 10-2010-0128607, filed on Dec. 15, 2010, the disclosures of which are incorporated herein in their entirety by reference.

BACKGROUND

1. Field

The present disclosure relates to a light-emitting device including a phosphor layer, a light-emitting device package employing the light-emitting device, a method of manufacturing the light-emitting device, and a method of packaging the light-emitting device.

2. Description of the Related Art

Light-emitting devices, for example, light-emitting diodes (LEDs) are semiconductor devices that may emit various light colors by forming a light-emitting source through a PN junction of a compound semiconductor. The LEDs have a long lifespan, may be made small and light, and have a strong light directivity, and thus the LEDs may be driven at a low voltage. Also, the LEDs are strong on impact and vibration, do not need to be preheated, may be driven in a simple way, and may be packaged in various forms, and thus the LEDs may be used for various purposes.

Recently, a blue LED and an ultra-violet (UV) LED formed using a nitride having a high physical and chemical characteristics have been introduced. Also, white light or other monochromatic light may be formed by using the blue LED or the UV LED and a phosphor material, and thus the application of the LEDs is becoming wider.

SUMMARY

Provided is a light-emitting device that may reduce chromaticity inferiorities of light emitted from side surfaces of a substrate and may obtain a uniform color quality of light, a light-emitting device package employing the light-emitting device, a method of manufacturing the light-emitting device, and a method of packaging the light-emitting device.

Additional aspects will be set forth in part in the description which follows and, in part, will be apparent from the description, or may be learned by practice of the presented embodiments.

According to an aspect of the present invention, a light-emitting device includes a light-transmissive substrate having a top surface, a bottom surface, and side surfaces; a light-emitting unit formed on the top surface of the light-transmissive substrate; and a phosphor layer covering all the side surfaces of the light-transmissive substrate.

The phosphor layer may cover the side surfaces and the bottom surface of the light-transmissive substrate.

A thickness of the phosphor layer may be in the range of about 30 to about 300 µm.

The light-transmissive substrate may be a sapphire substrate.

The light-emitting unit may emit blue light, and the phosphor layer may change the blue light to white light.

According to another aspect of the present invention, a light-emitting device package includes a package body including a terminal unit; a light-emitting device that includes: a light-transmissive substrate having a top surface, a bottom surface, and side surfaces; a light-emitting unit formed on the top surface of the light-transmissive substrate; and a phosphor layer covering all the side surfaces of the light-transmissive substrate, and mounted on the package body; and a wire for electrically connecting the light-emitting unit and the terminal unit.

The phosphor layer may cover the side surfaces and the bottom surface of the light-transmissive substrate.

A thickness of the phosphor layer may be in the range of about 30 to about 300 µm.

The light-emitting device package may further include a second phosphor layer covering the light-emitting unit.

The light-emitting unit may emit blue light, and the phosphor layer and the second phosphor layer may change the blue light to white light.

The light-transmissive substrate may be a sapphire substrate.

The light-emitting device may be packaged by using any one method selected from the group consisting of a pre-mold method, a wire-bonding method, and a flip-chip-bonding method.

According to another aspect of the present invention, a method of manufacturing a light-emitting device, the method includes transferring a plurality of light-emitting device chips, each including a light-transmissive substrate having a top surface, a bottom surface, and side surfaces and a light-emitting unit formed on the top surface of the light-transmissive substrate, on a transfer body so that side surfaces of the light-emitting device chips are spaced apart from one another and so that the light-emitting unit faces toward the transfer body; depositing a fluorescent material-containing resin to fill gaps between the plurality of light-emitting device chips, and then hardening the fluorescent material-containing resin; and forming the light-emitting device in which a phosphor layer covering all the side surfaces of the light-transmissive substrate is formed, by dicing the fluorescent material-containing resin hardened in the gap.

The transferring of the plurality of light-emitting device chips on the transfer body may include: dividing the plurality of light-emitting device chips from a wafer in which the plurality of light-emitting device chips are formed; and classifying the divided light-emitting device chips by rank and transferring the classified light-emitting device chips on the transfer body.

The classifying and transferring of the divided light-emitting device chips may include: attaching the classified light-emitting device chips onto an adhesive tape so that side surfaces of the light-emitting device chips are spaced apart from one another and so that the bottom surface of the light-transmissive substrate faces toward the adhesive tape; and transferring the light-emitting device chips from the adhesive tape onto the transfer body.

The fluorescent material-containing resin may be deposited to fill the gaps between the plurality of light-emitting device chips and to cover the bottom surfaces of the light-transmissive substrates of the light-emitting device chips, and wherein the light-emitting device, in which the phosphor layer covering the side surfaces and the bottom surface of the light-transmissive substrate is formed, is formed by dicing the fluorescent material-containing resin hardened in the gap.

A thickness of the phosphor layer may be in the range of about 30 to about 300 μm.

The light-emitting unit may emit blue light, and the phosphor layer may change the blue light to white light.

The light-transmissive substrate may be a sapphire substrate.

According to another aspect of the present invention, a method of packaging a light-emitting device, the method includes mounting a light-emitting device, which includes a light-emitting unit and a light-transmissive substrate and in which a phosphor layer covering all the side surfaces of the light-transmissive substrate is formed, on a package body by using any one method selected from the group consisting of a pre-mold method, a wire-bonding method, and a flip-chip-bonding method; and forming a second phosphor layer by depositing a fluorescent material-containing resin on the light-emitting unit.

The phosphor layer may cover side surfaces of the light-transmissive substrate and a bottom surface that is an opposite surface to a top surface on which the light-emitting unit is formed.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
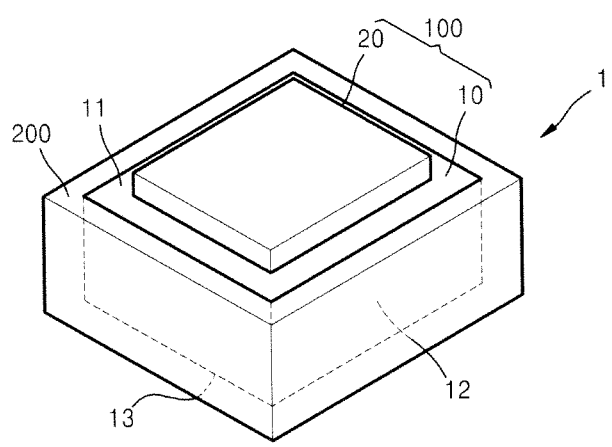
FIG. 1 is a schematic perspective view of a light-emitting device according to an embodiment of the present invention.

Hereinafter, the present invention will be described in detail by explaining exemplary embodiments of the invention with reference to the attached drawings. The same reference numerals in the drawings denote the same element. In the drawings, the thicknesses of layers and regions are exaggerated for clarity.

Figure 2:
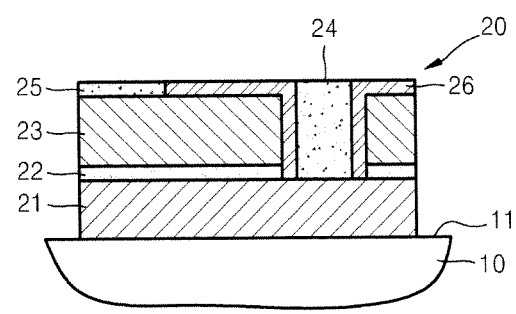
FIG. 2 is a cross-sectional view of a light-emitting unit of the light-emitting device of FIG. 1.

FIG. 1 is a schematic perspective view of a light-emitting device 1 according to an embodiment of the present invention. FIG. 2 is a cross-sectional view of a light-emitting unit 20 of the light-emitting device of FIG. 1. Referring to FIGS. 1 and 2, the light-emitting device 1 includes a light-emitting device chip 100 and a phosphor layer 200.

The light-emitting device chip 100 may be a light-emitting diode chip. The light-emitting diode chip may emit blue, green, red light, etc. according to a material of a compound semiconductor for forming the light-emitting diode chip.

The light-emitting device chip 100 may include a substrate 10 and the light-emitting unit 20 that is formed on the substrate 10 and emits light.

The substrate 10 may be a light-transmissive substrate including a top surface 11, side surfaces 12, and a bottom surface 13. The light-transmissive substrate may be, for example, a sapphire substrate, a zinc-oxide (ZnO) substrate, a gallium nitride (GaN) substrate, a silicon carbide (SiC) substrate, or an aluminum nitride (AlN) substrate.

The light-emitting unit 20 is disposed on the top surface 11 of the substrate 10. For example, the light-emitting unit 20 of a blue light-emitting diode chip may include an active layer 22 having a quantum well layer structure in which GaN and InGaN are alternately formed, a P-type clad layer 23 in which a compound semiconductor formed of $Al_xGa_yN_z$ is formed on the active layer 22, and an N-type clad layer 21 in which a compound semiconductor formed of $Al_xGa_yN_z$ is formed under the active layer 22. Although not shown in FIGS. 1 and 2, a buffer layer may be interposed between the N-type clad layer 21 and the substrate 10 before growing the N-type clad layer 21 so as to increase lattice-matching between the N-type clad layer 21 and the substrate 10. An N-electrode 24 and a P-electrode 25 are electrically connected to the N-type clad layer 21 and the P-type clad layer 23, respectively. Although not shown in FIGS. 1 and 2, a bonding pad for a wire-bonding process may be formed on the N-electrode 24 and the P-electrode 25. A structure of the light-emitting unit 20 illustrated in FIG. 2 is just an example, and thus the present invention is not limited thereto.

In order to change light emitted from the light-emitting device chip 100, for example, blue light, to white light, the phosphor layer 200 may be formed. The phosphor layer 200 may be a phosphor-containing resin formed by mixing fluorescent particles in a binder resin. The fluorescent particles may be a single species, and may be a plurality of species that are mixed at a predetermined ratio. The binder resin may be a polymer that may satisfy a high adhesive property, a high light-transmissive property, a high thermal resistance, a high light refractive index, a water tolerance, etc. For example, the binder resin may be an epoxy-based resin or silicon which is an inorganic polymer. The binder resin may include a silane-based material as an additive agent for increasing adhesion. Also, the binder resin may include various additive agents according to its purpose. The phosphor layer 200 may be formed by depositing a fluorescent-containing polymer on a predetermined position and hardening the fluorescent-containing polymer. A method of forming the phosphor layer 200 will be described in detail later.

Light generated from the light-emitting unit 20 of the light-emitting device chip 100 may exit upward from the light-emitting unit 20. A part of the light may spread in the light-transmissive substrate 10 and then may exit through the side surfaces 12 of the substrate 10. In order to change the color of light emitted through the side surfaces 12, the light-emitting device 100 according to the current embodiment includes the phosphor layer 200 covering all the side surfaces 12 of the substrate 10. The light emitted through the side surfaces 12 of the substrate 10 passes through the phosphor layer 200 to exit. Accordingly, for example, when blue light exits from the light-emitting device chip 100 and the phosphor layer 200 contains fluorescent particles for changing blue light to white light, the light exiting through the side surfaces 12 of the substrate 10 may be changed to white light having a high quality by passing through the phosphor layer 200.

The phosphor layer 200 may be formed to cover the side surfaces 12 and the bottom surface 13 of the substrate 10. The light-emitting device 1 may be formed on a circuit substrate through flip-chip bonding, and light may exit through the bottom surface 13 and the side surfaces 12 of the substrate 10. In this case, the phosphor layer 200 may be formed to cover the side surfaces 12 and the bottom surface 13 of the substrate 10.

A thickness of the phosphor layer 200 may be in the range of about 30 μm to about 300 μm. Thicknesses of the phosphor layer 200 covering the side surface 12 and the bottom surface 13 may be the same, but the present invention is not limited thereto. The phosphor layer 200 covering the side surfaces 12 and the bottom surface 13 may be determined to have thicknesses appropriate for changing light emitted from the light-emitting device chip 100 to light having a desired chromaticity.

Hereinafter, a method of manufacturing the light-emitting device 100 illustrated in FIGS. 1 and 2 will be described.

Figure 3A:
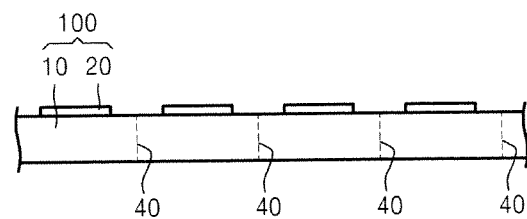
FIGS. 3A through 3J are diagrams for explaining a method of manufacturing the light-emitting device of FIG. 1.

First, the light-emitting device chip 100 in which the light-emitting unit 20 is formed on the substrate 10, which is a light-transmissive substrate, is prepared. Referring to FIG. 3A, the light-emitting device chip 100 may be provided in the form of a wafer in which a plurality of the light-emitting units 20 are disposed on the substrate 10 by performing a series of semiconductor processes. The substrate 10 is diced along a dicing line 40 by using a mechanical cutter or a laser cutter so as to individually obtain the light-emitting device chip 100. The dicing line 40 is a virtual line for individually dividing the light-emitting device chips 100.

The divided light-emitting device chips 100 may be classified by rank. That is, a light-emitting wavelength of the light-emitting device chip 100 is measured, and then light-emitting device chips 100 having a similar light-emitting characteristic may be classified. As such, a process of forming a fluorescent material to be described later may be performed by classifying the light-emitting device chips 100 having a similar light-emitting characteristic by rank. Thus, the light-emitting device 1 having a uniform chromaticity may be manufactured by controlling an amount of a fluorescent material-containing resin, a type of fluorescent particle, and an amount of the fluorescent particle for each rank.

Figure 3B:
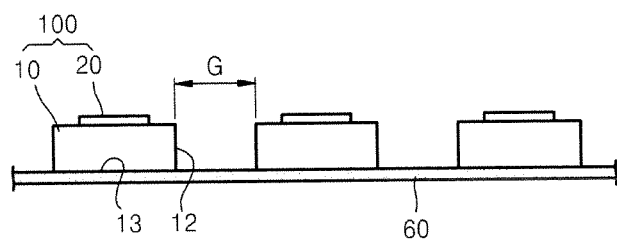
Figure 3C:
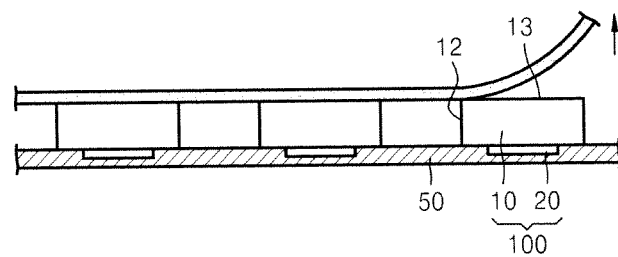
Figure 3D:
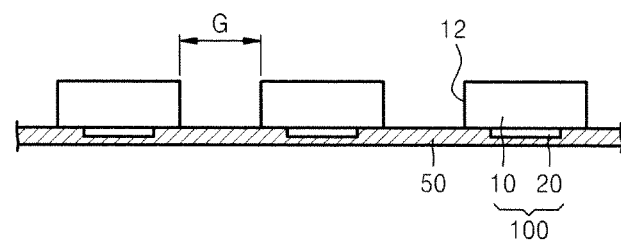

Next, as illustrated in FIG. 3D, the light-emitting device chips 100 are arranged on a transfer body 50 so that the light-emitting unit 20 faces downward. The transfer body 50 may be, for example, a UV tape having a thermal resistance. The light-emitting device chips 100 may be arranged on and then attached to the transfer body 50 by radiating UV light thereon. A gap G between the light-emitting device chips 100 may be determined in consideration of a thickness of the phosphor layer 200 to be formed on the side surfaces 12 of the substrate 10. For example, the gap G may be obtained by adding an expected loss of the thickness of the phosphor layer 200 in a dicing process to be described later to twice the thickness of the phosphor layer 200 to be formed on the side surfaces 12 of the substrate 10.

A process of arranging the light-emitting device chips 100 on the transfer body 50 may be performed by using the process illustrated in FIGS. 3B and 3C. First, as illustrated in FIG. 3B, the light-emitting device chips 100 are arranged on an adhesive tape 60 so that the bottom surface 13 of the substrate 10 faces downward. At this time, the side surfaces 12 of the substrate 10 of the light-emitting device chip 100 is spaced apart by the gap G from the adjacent side surface 12 of the adjacent substrate 10 of the adjacent light-emitting device chip 100. Next, the adhesive tape 60 onto which the light-emitting device chips 100 are attached is reversed and disposed on the transfer body 50 so that the light-emitting unit 20 faces toward the transfer body 50. Then, the adhesive tape 60 is separated from the bottom surface 13 of the substrate 10. Thus, the light-emitting device chips 100 are transferred on the transfer body 50 so that the light-emitting units 20 face downward. The light-emitting device chips 100 are attached onto the transfer body 50 by radiating UV light on the transfer body 50. The light-emitting device chips 100 may be arranged on the transfer body 50 by performing the above-described transfer process as illustrated in FIG. 3D.

Figure 3E:
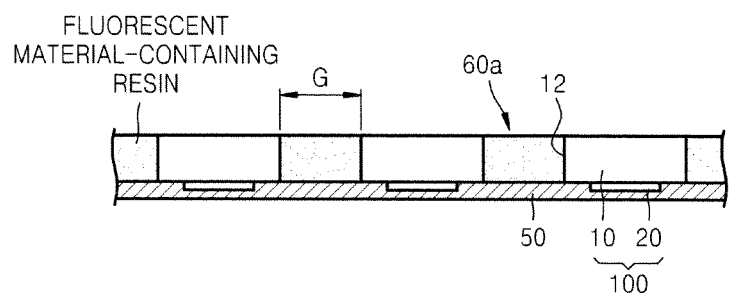
Figure 3F:
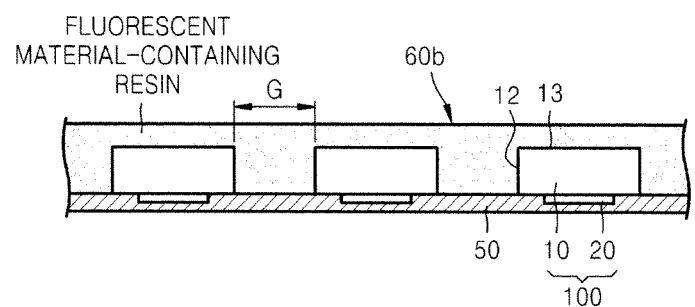

Next, a fluorescent material-containing resin is deposited on the gap G and is then hardened. In this process, for example, a compression mold method may be used. As illustrated in FIG. 3E, the unhardened fluorescent material-containing resin is deposited on the gap G, and is then pressed and molded at a temperature of from about 100 to about 150 □. Then, the fluorescent material-containing resin filled in the gap G is cooled. In order to form the phosphor layer 200 up to the bottom surface 13 of the substrate 10, a sufficient amount of fluorescent material-containing resin is deposited so as to cover the bottom surface 13 of the substrate 10 as illustrated in FIG. 3F, and is then pressed, molded, and cooled. By performing the above-described process, a molding body 60a in which the fluorescent material-containing resin is molded on the side surfaces 12 of the light-emitting device chip 100 formed on the transfer body 50, and a molding body 60b in which the fluorescent material-containing resin is molded on the side surfaces 12 and the bottom surface 13 of the light-emitting device chip 100 formed on the transfer body 50 may be obtained.

Figure 3G:
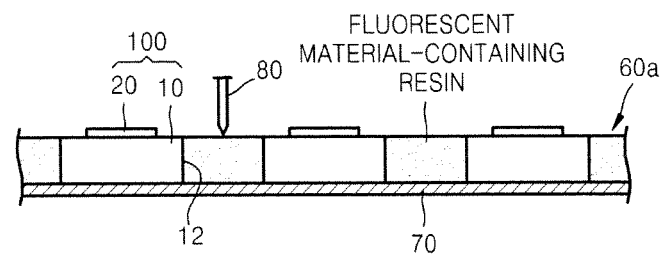
Figure 3H:
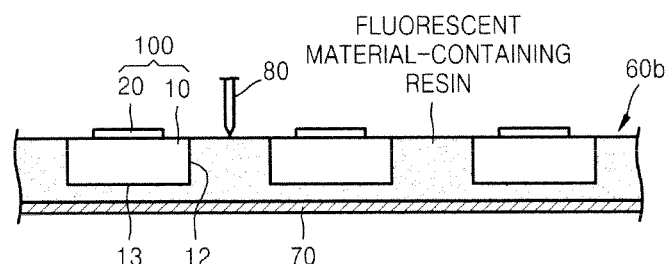

Next, the dicing process for individually dividing the light-emitting device 1 including the light-emitting device chip 100 and the phosphor layer 200 is performed. The dicing process may be performed by using, for example, a mechanical dicing method using a blade, a water-jet dicing method, a laser dicing method, or the like. In the dicing process, the molding bodies 60a and 60b may be transferred on a dicing tape 70, as illustrated in FIG. 3G or 3H. Then, the fluorescent material-containing resin is diced using, for example, a dicing blade 80, and the light-emitting device 1 is separated from the dicing tape 70.

Figure 3I:
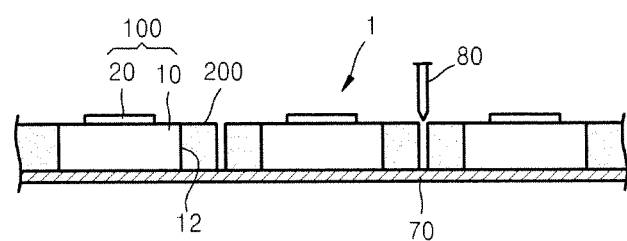
Figure 3J:
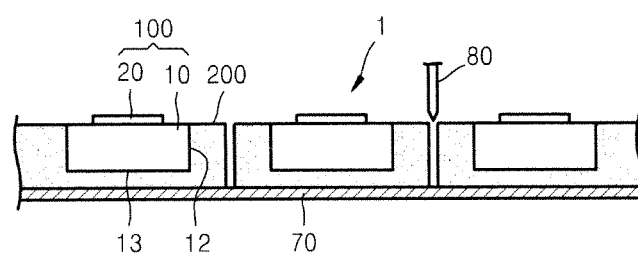

By performing the above-described process, as illustrated in FIGS. 3I and 3J, the light-emitting device 1 in which the phosphor layer 200 is formed on the side surfaces 12 of the substrate 10 and the light-emitting device 1 in which the phosphor layer 200 is formed on the side surfaces 12 and the bottom surface 13 of the substrate 10 may be obtained. The light-emitting device 1 having a desired chromaticity characteristic may be selected by performing a chromaticity measuring process before performing a packaging process to be described later.

Figure 4:
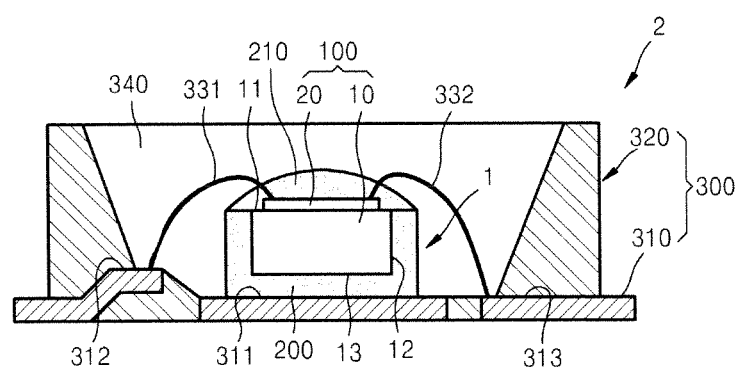
FIG. 4 is a cross-sectional view of a pre-mold type light-emitting device package, according to an embodiment of the present invention.

The light-emitting device 1 manufactured by performing the above-described process is manufactured into a light-emitting device package by performing a packaging process to be used in a light source apparatus. Referring to FIG. 4, the light-emitting device package 2 includes the light-emitting device 1, in which the phosphor layer 200 is formed on the side surfaces 12 or on the side surfaces 12 and the bottom surface 13, and a package body 300 to which the light-emitting device 1 is coupled. The light-emitting device package 2 illustrated in FIG. 4 is a pre-mold type package, and the package body 300 may include a lead frame 310 and a mold frame 320.

The lead frame 310 may be manufactured by performing a pressing process and an etching process on a metal plate such as aluminum or copper. The lead frame 310 may include a mounting portion 311 and first and second terminal units 312 and 313. The first and second terminal units 312 and 313 are electrically connected to the light-emitting unit 20 of the light-emitting device chip 100 by wires 331 and 332, respectively. For example, the first terminal unit 312 may be connected to the P-electrode 25 by the wire 331, and the second terminal unit 313 may be connected to the N-electrode 24 by the wire 332. The first and second terminal units 312 and 313 are exposed by a mold frame 320 and apply current to the light-emitting device chip 100.

A second phosphor layer 210 may be disposed on the light-emitting unit 20. The second phosphor layer 210 may cover the light-emitting unit 20 and the top surface 11 of the substrate 10. Also, the second phosphor layer 210 may cover a top surface of the phosphor layer 200. The second phosphor layer 210 may be formed of a material that is the same as that of the phosphor layer 200.

For example, when blue light is emitted from the light-emitting device chip 100 and the second phosphor layer 210 includes a fluorescent material for changing blue light to white light, light emitted upward from the light-emitting unit 20 is changed into white light by passing through the second phosphor layer 210 to exit. Also, since the blue light emitted through the side surfaces 12 of the substrate 10 passes through the phosphor layer 200, the blue light may be changed to white light to exit. Accordingly, all the blue light emitted from the light-emitting device chip 100 passes through the phosphor layer 200 or the second phosphor layer 210, and thus white light of a high quality may be obtained.

The mold frame 320 may be coupled to the lead frame 310 by performing, for example, an insert molding process. The mold frame 320 may be formed of, for example, an electrical insulating polymer. The mold frame 320 is formed to have a recessed shape so as to expose the mounting portion 311 and the first and second terminal units 312 and 313. The light-emitting device package 2 has a structure in which the light-emitting device 1 is disposed on a bottom surface of a recess 340 that has a concave shape.

Figure 5A:
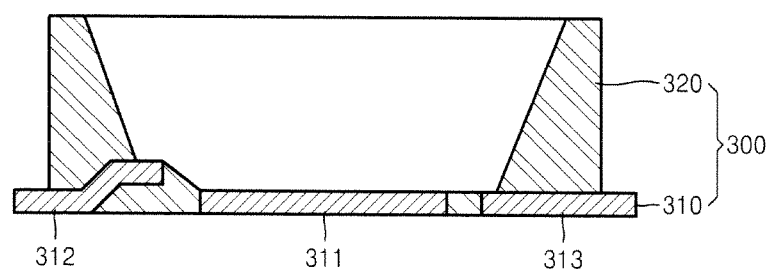
FIGS. 5A and 5B are cross-sectional views for explaining a method of packaging a light-emitting device according to a pre-mold method, according to embodiments of the present invention.

Hereinafter, a method of manufacturing the light-emitting device package 2 will be simply described with reference to FIGS. 5A and 5B.

First, the lead frame 310 including the mounting portion 311 and the first and second terminal units 312 and 313 is formed by processing a metal plate. Then, the mold frame 320 is coupled to the lead frame 310 by performing, for example, an insert injection molding process, and thus the package body 300 is formed as illustrated in FIG. 5A.

Figure 5B:
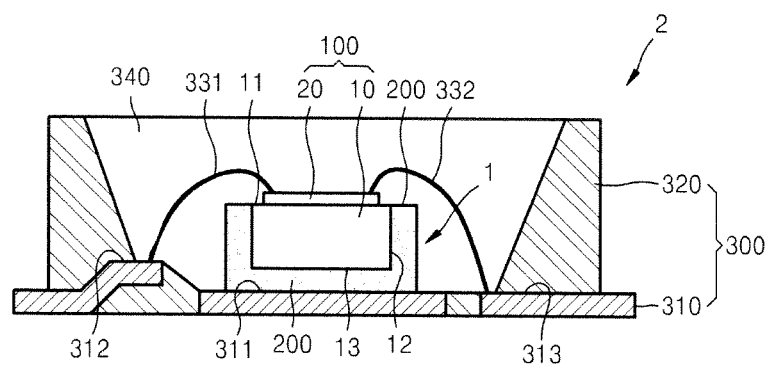

Next, as illustrated in FIG. 5B, the light-emitting device 1 in which the phosphor layer 200 is formed on the side surfaces 12 or on the side surfaces 12 and the bottom surface 13 is mounted on the mounting portion 311. Then, a wire-bonding process for electrically connecting the light-emitting unit 20 and each of the first and second terminal units 312 and 313 is performed by using the wires 331 and 332.

Then, a process of forming the second phosphor layer 210 on the light-emitting unit 20 is performed by depositing a fluorescent material-containing resin on the light-emitting unit 20. The fluorescent material-containing resin is deposited to cover the entire light-emitting unit 20, preferably, may be deposited to cover the entire light-emitting unit 20, the top surface 11 of the substrate 10, and the phosphor layer 200. Then, a hardening process is performed thereon, thereby manufacturing the light-emitting device package 2 illustrated in FIG. 4. A process of filling a light-transmissive protection resin in the recess 340 may further be performed as a subsequent process.

A method of forming the phosphor layer 200 and the second phosphor layer 210 by using a chip level dispensing (CLD) method may be considered. That is, in a process in which the light-emitting device chip 100 is formed instead of a process in which the light-emitting device package 2 is formed, a method of forming the phosphor layer 200 and the second phosphor layer 210 by depositing a fluorescent material-containing resin on an upper portion of the light-emitting device chip 100 may be considered. However, in the CLD method, the fluorescent material-containing resin is deposited on a surface of the light-emitting device chip 100 by using surface tension, and thus it is difficult to form the phosphor layer 200 on the side surfaces 12 of the light-emitting device chip 100. Accordingly, blue light leaking through the side surfaces 12 of the substrate 10 is emitted without passing through the phosphor layer 200, thereby causing chromaticity inferiorities of the blue light. Also, according to the CLD method, since the fluorescent material-containing resin is deposited on the light-emitting unit 200 in a process in which the light-emitting device chip 100 is formed before performing a wire-bonding process, a complicated process for exposing the bonding pad for a wire-bonding process in the light-emitting unit 20 is required.

In the light-emitting device package 2 according to the present invention, the light-emitting device 1, in which the phosphor layer 200 is formed on the phosphor layer 200 of the substrate 10 or on the side surfaces 12 and the bottom surface 13 of the substrate 10, is mounted on the package body 300, and the second phosphor layer 210 is formed after performing the wire-bonding process, and thus the phosphor layer 200 having a uniform quality may be formed on upper, lower, and side surfaces of the light-emitting device chip 100. Accordingly, light emitted from the light-emitting device chip 100 may be changed to light having a uniform chromaticity.

Also, the method of forming the phosphor layer 200 and the second phosphor layer 210 by using the CLD method may be limited to a case where a thin GaN-type substrate is used. However, because it is difficult to form a phosphor layer on side surfaces of a substrate, it is difficult to use the CLD method when a relatively low-priced sapphire substrate is used. However, according to the light-emitting device, the method of manufacturing the light-emitting device, and the light-emitting device package according to the present invention, even when a relatively thick sapphire substrate is used, a phosphor layer may be uniformly formed even on side surfaces of the sapphire substrate. Accordingly, a light-emitting device and a light-emitting device package having a high chromaticity may be realized.

Figure 6:
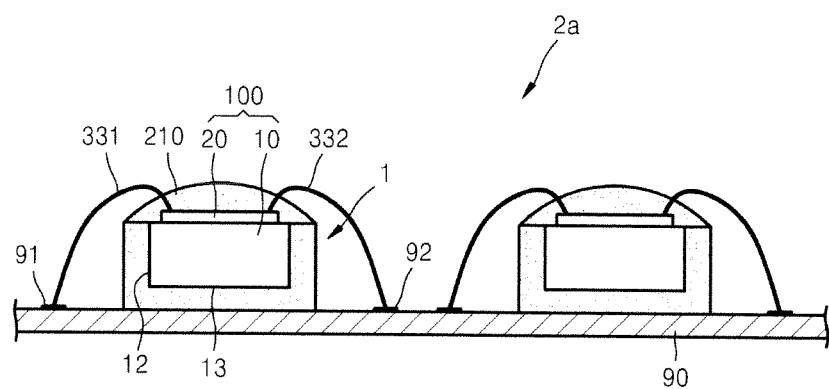
FIG. 6 is a cross-sectional view of a wire-bonding type light-emitting device package, according to an embodiment of the present invention.

In the above-described embodiment, a case where the light-emitting device 1 is packaged by using a pre-mold method has been described, but the scope of the present invention is not limited thereto. For example, the light-emitting device 1 may be packaged by using a wire-bonding method. Referring to FIG. 6, a package body of a wire-bonding type light-emitting device package 2a includes a circuit substrate 90. The wire-bonding type light-emitting device package 2a may be formed by mounting the light-emitting device 1, in which the phosphor layer 200 is formed on the side surfaces 12 or on the side surfaces 12 and the bottom surface 13, on the circuit substrate 90, electrically connecting the light-emitting unit 20 and electrical terminal units 91 and 92 disposed on the circuit substrate 90 respectively by the wires 331 and 332, and depositing a fluorescent material-containing resin on the light-emitting unit 20. In this case, a plurality of the light-emitting devices 1 may be formed on the circuit substrate 90 through wire-bonding.

Figure 7:
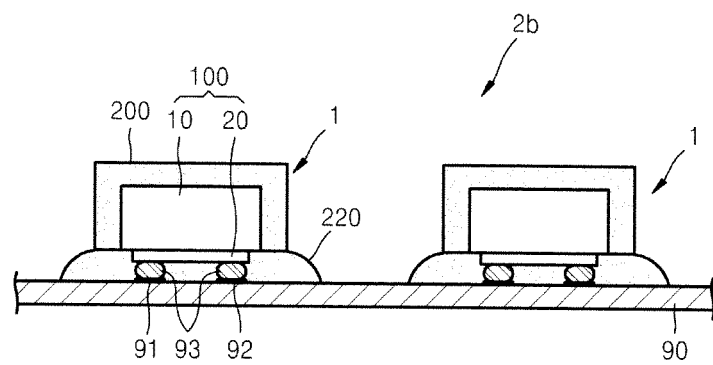
FIG. 7 is a cross-sectional view of a flip-chip-bonding type light-emitting device package, according to an embodiment of the present invention.

Also, the light-emitting device 1 may be packaged through flip-chip-bonding. Referring to FIG. 7, a package body of a light-emitting device package 2b includes the circuit substrate 90. The light-emitting device 1 is formed on the circuit substrate 90 through flip-chip-bonding so that the light-emitting unit 20 faces downward, and thus the light-emitting unit 20 may be electrically connected to the electrical terminal units 91 and 92 formed on the circuit substrate 90. In this case, since light exits from the bottom surface 13 and the side surfaces 12 of the substrate 10, the light-emitting device 1 in which the phosphor layer 200 is formed on the bottom surface 13 and the side surfaces 12 of the substrate 10 may be preferably employed. After the flip-chip-bonding process is performed, a fluorescent material-containing resin may be deposited between the light-emitting unit 20 and the circuit substrate 90 so as to form the second phosphor layer 210. A plurality of the light-emitting devices 1 may be formed on the circuit substrate 90 through flip-chip-bonding.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A light-emitting device package, comprising:
a package body including a mold frame and a lead frame including a mounting portion and a terminal area and having a top surface and a bottom surface;
a light-emitting device that includes:
a light-transmissive substrate having a top surface, a bottom surface, and side surfaces;
a light emitter on the top surface of the light-transmissive substrate; and
a phosphor layer covering all the side surfaces of the light-transmissive substrate, wherein the light emitter is mounted on the top surface of the mounting portion; and
a connector to electrically connect the light-emitter to the top surface of the terminal area, wherein
the package body does not include a wire that protrudes from the bottom surface.

2. The light-emitting device package of claim 1, wherein the phosphor layer covers the side surfaces and contacts the bottom surface of the light-transmissive substrate.

3. The light-emitting device package of claim 1, wherein a thickness of the phosphor layer is in the range of about 30 to about 300 μm.

4. The light-emitting device package of claim 1, further comprising:
a second phosphor layer on the light-emitting device, wherein
the light emitter is configured to emit blue light,
the phosphor layer is a first phosphor layer, and
the first phosphor layer and the second phosphor layer are configured to change the blue light to white light.

5. The light-emitting device package of claim 1, wherein the light-transmissive substrate is a sapphire substrate.

6. The light-emitting device package of claim 1, wherein the light-emitting device is packaged by using anyone method selected from the group consisting of a pre-mold method, a wire-bonding method, and a flip-chip-bonding method.

7. A light-emitting device package comprising:
a package body including a mold frame and a lead frame including a mounting portion and a terminal area and having a top surface and a bottom surface;
a light-emitting device that includes:
a light-transmissive substrate having a top surface, a bottom surface, and side surfaces;
a light-emitter on the top surface of the light-transmissive substrate;
a first phosphor layer at least covering all the side surfaces of the light-transmissive substrate; and
a second phosphor layer covering the light-emitter, wherein the light-emitting device is mounted on the top surface of the mounting portion; and
a connector electrically connecting the light-emitter to the top surface of the terminal area, wherein
a portion of the first phosphor layer contacts a portion of the second phosphor layer without any stepped portion, and
the package body does not include a wire that protrudes from the bottom surface.

8. The light-emitting device package of claim 7, wherein the first phosphor layer covers the side surfaces and the bottom surface of the light-transmissive substrate.

9. The light-emitting device package of claim 7, wherein a thickness of the first phosphor layer is in the range of about 30 to about 300 μm.

10. The light-emitting device package of claim 7, wherein the light-emitter is configured to emit blue light, and the first phosphor layer and the second phosphor layer are configured to change the blue light to white light.

11. The light-emitting device package of claim 7, wherein the light-transmissive substrate is a sapphire substrate.

12. The light-emitting device package of claim 7, wherein the light-emitting device is packaged by using any one method selected from the group consisting of a pre-mold method, a wire-bonding method, and a flip-chip-bonding method.

13. A light-emitting device, comprising:
a substrate;
a light-emitting unit on the substrate to emit light, wherein the substrate is a light-transmissive substrate including a top surface, side surfaces, and a bottom surface, wherein the light-emitting unit is on the top surface of the substrate and includes an active layer having a quantum well layer structure in which GaN and lnGaN are alternately formed, a P-type clad layer in which a compound semiconductor formed of AlGaN is formed on the active layer, and an N-type clad layer formed under the active layer;
an N-electrode and a P-electrode electrically connected to the N-type clad layer and the P-type clad layer, respectively;
a phosphor layer including a phosphor-containing resin, the phosphor layer covering all of the side surfaces of the substrate to change a color of light emitted through the side surfaces, wherein
the package body does not include a wire that protrudes from the bottom surface.

14. The light-emitting device of claim 13, wherein:
the light-emitting device is mounted on a circuit substrate by flip-chip bonding,
light exits through the bottom surface and the side surfaces of the substrate, and
the phosphor layer covers the side surfaces and the bottom surface of the substrate.

15. The light-emitting device of claim 13, wherein a thickness of the phosphor layer is in a range of about 30 μm to about 300 μm.

16. The light-emitting device of claim 13, wherein thicknesses of the phosphor layer covering the side surface and the bottom surface are substantially equal.

17. The light-emitting device of claim 13, wherein the phosphor layer covering the side surfaces and the bottom surface has thicknesses to change emitted light to have a predetermined chromaticity.

* * * * *